US012131939B2

United States Patent
Lee et al.

(10) Patent No.: US 12,131,939 B2
(45) Date of Patent: Oct. 29, 2024

(54) SUBSTRATE TRANSFER ROBOT FOR TRANSFERRING SUBSTRATE IN VACUUM CHAMBER

(71) Applicant: T-Robotics Co., Ltd., Osan-si (KR)

(72) Inventors: Soo Jong Lee, Suwon-si (KR); Chang Seong Lee, Hwaseong-si (KR); Seung Young Baek, Osan-si (KR); Moon Gi Hur, Suwon-si (KR)

(73) Assignee: T-Robotics Co., Ltd., Osan-si (KR)

( * ) Notice: Subject to any disclaimer, the term of this patent is extended or adjusted under 35 U.S.C. 154(b) by 85 days.

(21) Appl. No.: 18/101,019

(22) Filed: Jan. 24, 2023

(65) Prior Publication Data
US 2023/0260822 A1   Aug. 17, 2023

(30) Foreign Application Priority Data
Feb. 15, 2022   (KR) ........................ 10-2022-0019825

(51) Int. Cl.
*H01L 21/687*   (2006.01)
*B25J 9/10*   (2006.01)
*B25J 11/00*   (2006.01)
*B25J 19/00*   (2006.01)

(52) U.S. Cl.
CPC ...... *H01L 21/68707* (2013.01); *B25J 9/1065* (2013.01); *B25J 11/0095* (2013.01); *B25J 19/0075* (2013.01)

(58) Field of Classification Search
None
See application file for complete search history.

(56) References Cited

U.S. PATENT DOCUMENTS

2023/0260821 A1* 8/2023 Lee .................. H01L 21/67742
414/751.1

FOREIGN PATENT DOCUMENTS

KR   10-2011-0052454 A   5/2011
KR   10-2307690 B1   10/2021

* cited by examiner

*Primary Examiner* — Michael S Lowe
(74) *Attorney, Agent, or Firm* — Kaplan Breyer Schwarz, LLP

(57) ABSTRACT

A substrate transfer robot for transferring a substrate in a vacuum chamber, includes: a transfer arm platform having coupling holes, wherein link connecting members with blades are engaged at front and rear areas of the transfer arm platform and a support shaft of a lower support is inserted into the lower space of one of the coupling holes; and a first and a second transfer arm part each including an end effector for supporting the substrate, multiple transfer link arms, multiple subordinate link arms and a common link arm that are connected to each other or to the transfer arm platform, wherein, the transfer link arms include at least some of drive shafts, interlocked with transfer driving motors or speed reducers, and output shafts interlocked with the drive shafts, and wherein the end effectors are positioned at different heights from each other through using a bracket.

6 Claims, 16 Drawing Sheets

CONVENTIONAL SUBSTRATE
TRANSFER ROBOT

SUBSTRATE TRANSFER ROBOT OF
PRESENT DISCLOSURE

ELASTIC DEFORMATION OF LINKS IN RESPONSE TO DISTURBANCE CAUSED BY δ

δ ; LENGTHS EXTENDED DUE TO THERMAL EXPANSION

CONVENTIONAL SUBSTRATE TRANSFER ROBOT

SUBSTRATE TRANSFER ROBOT OF
PRESENT DISCLOSURE

SUBSTRATE TRANSFER ROBOT FOR TRANSFERRING SUBSTRATE IN VACUUM CHAMBER

CROSS REFERENCE OF RELATED APPLICATION

This present application claims the benefit of the earlier filing date of Korean non-provisional patent application No. 10-2022-0019825, filed Feb. 15, 2022, the entire contents of which being incorporated herein by reference.

FIELD OF THE DISCLOSURE

The present disclosure relates to a substrate transfer robot; and more particularly, to the substrate transfer robot for transferring substrates in a vacuum chamber that is located within a substrate processing equipment.

BACKGROUND OF THE DISCLOSURE

In general, a substrate such as a wafer for a semiconductor device, a glass substrate for a display device, or a glass substrate for a thin film solar cell is manufactured by performing various processes on the substrate. During these processes, the substrate is loaded and processed in a substrate processing equipment that provides optimal conditions for each of the processes.

Nowadays, in order to improve productivity, a cluster-type substrate processing equipment capable of collectively processing the substrate is being developed and used.

The cluster-type substrate processing equipment includes a load lock chamber for storing the substrate, a transfer chamber for transferring the substrate, and a plurality of process chambers for performing each manufacturing process.

Additionally, a substrate transfer robot, installed in the transfer chamber that is in a vacuum state, may transfer the substrate back and forth between the transfer chamber and the load lock chamber, among multiple transfer chambers, or in and out of the process chambers.

Recently, in order to cope with a large size and a heavy weight of the substrate and to improve a substrate processing capability, various researches on high-rigidity substrate transfer robots are in progress.

Also, there is a need for operating a more compact substrate transfer robot in a state capable of maintaining a high vacuum condition in order to improve an efficiency of an installation area of a manufacturing equipment.

In response, various structures of substrate transfer robot suitable for meeting these needs are being proposed, such as constructing arms of the conventional substrate transfer robot into link structures, sealing an inside of each of the arms forming the link structure, forming an arm platform to which link arms are coupled as a sealed structure, installing a driving motor inside the sealed structure, and installing a speed reducer required for a rotational movement of the link arms in each inside of the link arms.

Especially, by referring to FIG. 1, it can be seen that the conventional substrate transfer robot makes use of two robot arms, i.e., an upper arm 1 and a lower arm 2, in order to improve its throughput, and an upper end effector 3 and a lower end effector 4 for substrate transfer are coupled to the ends of the upper arm 1 and the lower arm 2, respectively. Herein, the upper end effector 3 and the lower end effector 4 have to maintain a same transfer path at different heights.

Therefore, as shown in FIG. 1, in order for the upper end effector 3 and the lower end effector 4 of the conventional substrate transfer robot to move in a straight line while avoiding collisions with the upper arm 1 and the lower arm 2 on the transfer path, the upper end effector 3 and the lower end effector 4 are coupled respectively to the ends of the upper arm 1 and the lower arm 2 in a way that a moving path 5 of a center of gravity of each of the upper end effector 3 and the lower end effector 4 is respectively distanced apart from a moving path 6 of driving force by a regular distance a.

However, when off-centered positions of the upper end effector 3 and the lower end effector 4 are respectively coupled to the upper arm 1 and the lower arm 2 as mentioned above, vibrations or disturbance b is generated on the upper end effector 3 and the lower end effector 4 during linear motions of the upper end effector 3 and the lower end effector 4, causing difficulties in accurately controlling the transfer direction of the substrate.

Also, by referring to the conventional substrate transfer robot in FIG. 2, a first transfer link arm 11, linked to a transfer arm platform and forming a single parallel link 10, is subjected to thermal expansion caused by heat generated from operations of an internal speed reducer and the like. Subsequently, a parallelogram structure of another single parallel link 20 formed by a second transfer link arm 21, whose one end is coupled to the first transfer link arm 11 and the other end is coupled to the end effector 30, is subjected to deformation as indicated by the dotted line in FIG. 2. As a result, the position, i.e., direction, of the end effector 30 coupled to the other end of the second transfer link arm 21 is gradually changed.

Herein, a magnitude A of position change of a tip of the end effector 30 is approximated by multiplying a length 6 extended by the thermal expansion of the first transfer link arm 11 and a ratio L/d of a length L of the end effector to a length d of a frame of the single parallel link 10 formed on the transfer arm platform.

Further, the ratio L/d of the length L of the end effector to the length d of the frame of the single parallel link 10 formed on the transfer arm platform is generally designed to have a value of about 8 to 10. As a consequence, even when there is a slight change in the length of the first transfer link arm 11 due to the thermal expansion caused by a slight change of temperature, the magnitude A of position change of a tip of the end effector 30 becomes significantly large.

Since this change in the position of the tip of the end effector 30 hinders delivering the substrate to a correct position, the conventional substrate transfer robot is preliminarily operated prior to performing the process of transferring the substrate, in order to minimize the change in the length of the first transfer link arm 11 caused by the thermal expansion. However, this causes a considerably long time to be wasted in preliminarily operating the conventional substrate transfer robot.

SUMMARY OF THE DISCLOSURE

It is an object of the present disclosure to solve all the aforementioned problems.

It is another object of the present disclosure to provide a substrate transfer robot that minimizes vibrations or disturbances generated on end effectors.

It is still another object of the present disclosure to provide the substrate transfer robot that minimizes changes in postures of the end effectors due to thermal expansion of a transfer link arm.

It is still yet another object of the present disclosure to provide the substrate transfer robot that increases throughput of transferring substrates.

It is still yet another object of the present disclosure to provide the substrate transfer robot capable of fundamentally preventing any generation of particles within a vacuum chamber.

In accordance with one aspect of the present disclosure, there is provided a substrate transfer robot for transferring a substrate in a vacuum chamber, including: a transfer arm platform through which a first coupling hole, a second coupling hole and a third coupling hole are formed respectively at a first center area, a first one-end area and a first opposite-end area thereof, wherein a first locking member, through which a first through-hole corresponding to a hollow of a support shaft is formed on a transfer robot coupling part of a lower support, compartmentalizes the first coupling hole into a first upper space sealed by a first cover and a first lower space, wherein a second locking member, through which a second through-hole is formed, compartmentalizes the second coupling hole into a second upper space and a second lower space sealed by a second cover, wherein a third locking member, through which a third through-hole is formed, compartmentalizes the third coupling hole into a third upper space and a third lower space sealed by a third cover, wherein a first link connecting member including a (1_1)-st blade and a (1_2)-nd blade for link connection is fixedly engaged at a front area, with a direction of the front area being a direction of a processing chamber from the substrate transfer robot when the substrate transfer robot is positioned to transfer the substrate to the processing chamber coupled with the vacuum chamber, wherein a second link connecting member including a (2_1)-st blade and a (2_2)-nd blade for link connection is fixedly engaged at a rear area corresponding to the front area, and wherein the support shaft at the lower support inserted into the first lower space is fixedly engaged with the first locking member; a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_1)-st transfer link arm, a (1_3)-rd subordinate link arm parallel to the (1_2)-nd transfer link arm, a (1_4)-th subordinate link arm parallel to the first common link arm, and a first end effector, wherein a first transfer driving motor and a first speed reducer, interlocked with the first transfer driving motor to reduce a rotational speed of the first transfer driving motor by half, are installed in a sealed inner space of the (1_1)-st transfer link arm, wherein a (1_1)-st drive shaft, having a hollow formed therein and interlocked with the first speed reducer, and a (1_1)-st output shaft interlocked with the (1_1)-st drive shaft are sealingly installed on a (1_1)-st one-end area of the (1_1)-st transfer link arm, wherein a (1_2)-nd drive shaft, having a hollow formed therein and interlocked with the first transfer driving motor, and a (1_2)-nd output shaft interlocked with the (1_2)-nd drive shaft are sealingly installed on a (1_1)-st opposite-end area of the (1_1)-st transfer link arm, wherein the (1_1)-st output shaft of the (1_1)-st transfer link arm is fixedly engaged with a first linking member that is inserted into the second upper space of the transfer arm platform to be fixedly engaged with the second locking member, wherein a (1_2)-nd one-end area of the (1_2)-nd transfer link arm is fixedly engaged with the (1-2)-nd output shaft of the (1_1)-st transfer link arm through a first fixed coupling shaft, wherein a second center area of the first common link arm is rotatably engaged with the first fixed coupling shaft, wherein a (1_4)-th one-end area of the (1_1)-st subordinate link arm is rotatably engaged with the (1_1)-st blade of the first link connecting member of the transfer arm platform, and a (1_4)-th opposite-end area of the (1_1)-st subordinate link arm is rotatably engaged with a (1_3)-rd one-end area of the first common link arm, wherein a (1_5)-th one-end area of the (1_2)-nd subordinate link arm is rotatably engaged with the (2_1)-st blade of the second link connecting member of the transfer arm platform, and a (1_5)-th opposite-end area of the (1_2)-nd subordinate link arm is rotatably engaged with a (1_3)-rd opposite-end area of the first common link arm, wherein a (1_6)-th one-end area of the (1_3)-rd subordinate link arm is rotatably engaged with the (1_3)-rd opposite-end area of the first common link arm, wherein a (1_7)-th one-end area of the (1_4)-th subordinate link arm is rotatably engaged with a (1_6)-th opposite-end area of the (1_3)-rd subordinate link arm, and a (1_7)-th opposite-end area of the (1_4)-th subordinate link arm is rotatably engaged with a (1_2)-nd opposite-end area of the (1_2)-nd transfer link arm, and wherein the first end effector is fixed to the (1_7)-th opposite-end area of the (1_4)-th subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_1)-st transfer link arm, a (2_3)-rd subordinate link arm parallel to the (2_2)-nd transfer link arm, a (2_4)-th subordinate link arm parallel to the second common link arm, and a second end effector, wherein a second transfer driving motor and a second speed reducer, interlocked with the second transfer driving motor to reduce a rotational speed of the second transfer driving motor by half, are installed in a sealed inner space of the (2_1)-st transfer link arm, wherein a (2_1)-st drive shaft, having a hollow formed therein and interlocked with the second speed reducer, and a (2_1)-st output shaft interlocked with the (2_1)-st drive shaft are sealingly installed on a (2_1)-st one-end area of the (2_1)-st transfer link arm, wherein a (2_2)-nd drive shaft, having a hollow formed therein and interlocked with the second transfer driving motor, and a (2_2)-nd output shaft interlocked with the (2_2)-nd drive shaft are sealingly installed on a (2_1)-st opposite-end area of the (2_1)-st transfer link arm, wherein the (2_1)-st output shaft of the (2_1)-st transfer link arm is fixedly engaged with a second linking member that is inserted into the third upper space of the transfer arm platform to be fixedly engaged with the third locking member, wherein a (2_2)-nd one-end area of the (2_2)-nd transfer link arm is fixedly engaged with the (2-2)-nd output shaft of the (2_1)-st transfer link arm through a second fixed coupling shaft, wherein a third center area of the second common link arm is rotatably engaged with the second fixed coupling shaft, wherein a (2_4)-th one-end area of the (2_1)-st subordinate link arm is rotatably engaged with the (1_2)-nd blade of the first link connecting member of the transfer arm platform, and a (2_4)-th opposite-end area of the (2_1)-st subordinate link arm is rotatably engaged with a (2_3)-rd one-end area of the second common link arm, wherein a (2_5)-th one-end area of the (2_2)-nd subordinate link arm is rotatably engaged with the (2_2)-nd blade of the second link connecting member of the transfer arm platform, and a (2_5)-th opposite-end area of the (2_2)-nd subordinate link arm is rotatably engaged with a (2_3)-rd opposite-end area of the second common link arm, wherein a (2_6)-th one-end area of the (2_3)-rd subordinate link arm is rotatably engaged with the (2_3)-rd opposite-end area of the second common link arm, wherein a (2_7)-th one-end area of the (2_4)-th subordinate link arm is rotatably engaged with a (2_6)-th opposite-end area of the (2_3)-rd subordinate link arm, and a (2_7)-th opposite-end area of the (2_4)-th subordinate link arm is rotatably engaged with a (2_2)-nd opposite-end area of the (2_2)-nd transfer link arm, and wherein the second end effector is fixedly engaged with the (2_7)-th opposite-end area of the (2_4)-th subordinate link arm through a bracket to thereby support the substrate.

As one example, the (1_1)-st opposite-end area of the (1_1)-st transfer link arm of the first transfer arm part is located at the front area of the transfer arm platform, and the (2_1)-st opposite-end area of the (2_1)-st transfer link arm of the second transfer arm part is located at the rear area of the transfer arm platform.

As another example, a joint, to which the (1_6)-th one-end area of the (1_3)-rd subordinate link arm and the (1_3)-rd opposite-end area of the first common link arm of the first transfer arm part are linked, is formed at a location same as or different from a location of a joint, to which the (1_5)-th opposite-end area of the (1_2)-nd subordinate link arm and the (1_3)-rd opposite-end area of the first common link arm of the first transfer arm part are linked, wherein a joint, to which the (2_6)-th one-end area of the (2_3)-rd subordinate link arm and the (2_3)-rd opposite-end area of the second common link arm of the second transfer arm part are linked, is formed at a location same as or different from a location of a joint, to which the (2_5)-th opposite-end area of the (2_2)-nd subordinate link arm and the (2_3)-rd opposite-end area of the second common link arm of the second transfer arm part are linked.

As another example, the transfer arm platform further includes: a first wiring hole bridging the first upper space and the second lower space; and a second wiring hole bridging the first upper space and the third lower space.

As another example, the transfer arm platform further includes: a (1_1)-st wiring hole and a (1_2)-nd wiring hole, each bridging the first upper space and one side of a body of the transfer arm platform; a (2_1)-st wiring hole, bridging the second lower space and the one side of the body of the transfer arm platform; a (2_2)-nd wiring hole, bridging the third lower space and the one side of the body of the transfer arm platform; a first sealing cover, sealing the (1_1)-st wiring hole and the (2_1)-st wiring hole at the one side of the body of the transfer arm platform; and a second sealing cover, sealing the (1_2)-nd wiring hole and the (2_2)-nd wiring hole at the one side of the body of the transfer arm platform.

As another example, the substrate transfer robot further includes: a first wiring for an operation of the first transfer driving motor; and a second wiring for an operation of the second transfer driving motor, wherein the first wiring is fed into the first transfer driving motor through the hollow of the support shaft and the hollow of the (1_1)-st drive shaft so as to prevent the first wiring from being exposed to an inner space of the vacuum chamber, and wherein the second wiring is fed into the second transfer driving motor through the hollow of the support shaft and the hollow of the (2_1)-st drive shaft so as to prevent the second wiring from being exposed to the inner space of the vacuum chamber.

BRIEF DESCRIPTION OF THE DRAWINGS

The accompanying drawings used to explain example embodiments of the present disclosure are only part of example embodiments of the present disclosure and other drawings can be obtained based on the drawings by those skilled in the art of the present disclosure without inventive work.

DETAILED DESCRIPTION OF THE PREFERRED EMBODIMENTS

Figure 1:
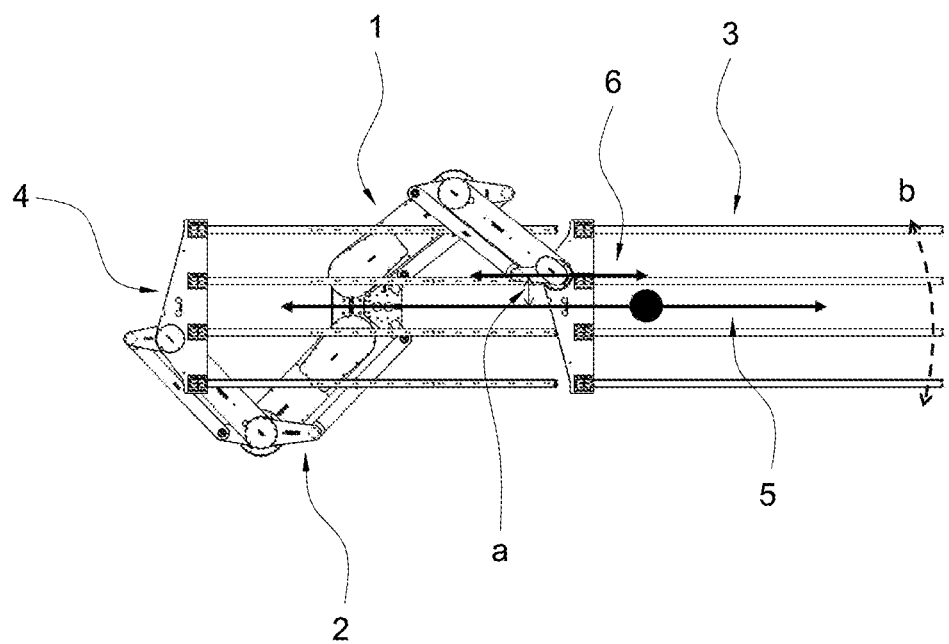
FIG. 1 and FIG. 2 are drawings schematically illustrating a conventional substrate transfer robot.
Figure 2:
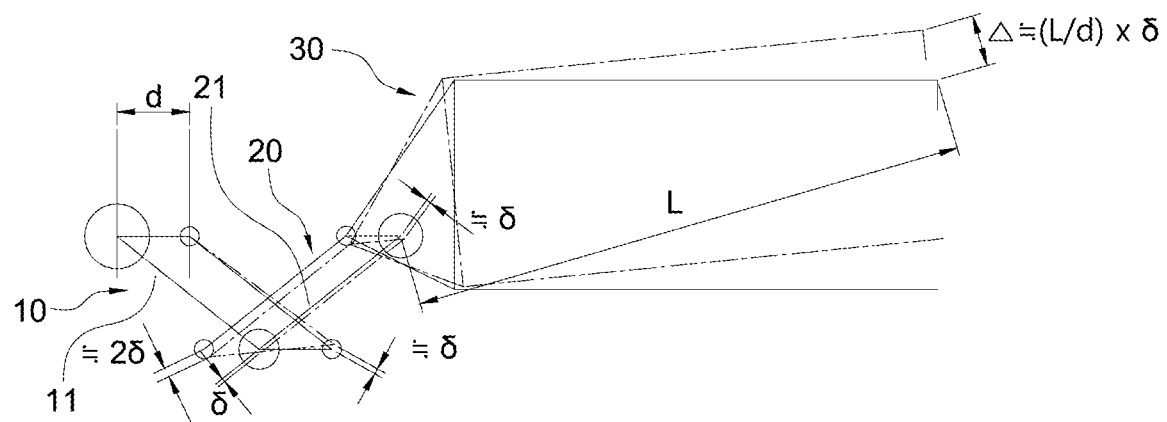

The following detailed description of the present disclosure refers to the accompanying drawings, which show by way of illustration a specific embodiment in which the present disclosure may be practiced, in order to clarify the objects, technical solutions and advantages of the present disclosure. These embodiments are described in sufficient detail to enable those skilled in the art to practice the present disclosure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

To allow those skilled in the art to carry out the present disclosure easily, the example embodiments of the present disclosure will be explained by referring to attached diagrams in detail as shown below.

Figure 3:
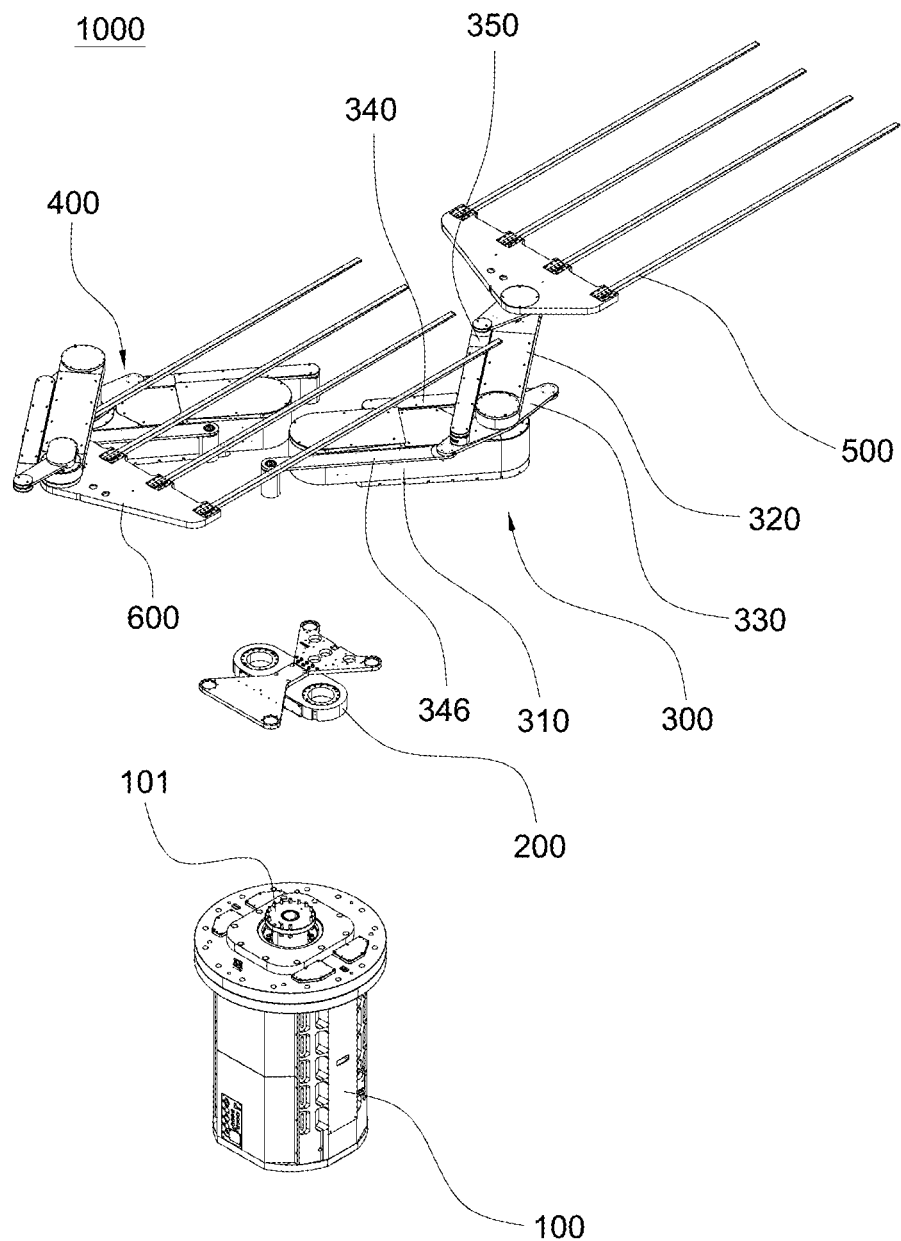
FIG. 3 and FIG. 4 are drawings schematically illustrating a substrate transfer robot in accordance with one example embodiment of the present disclosure.
Figure 4:
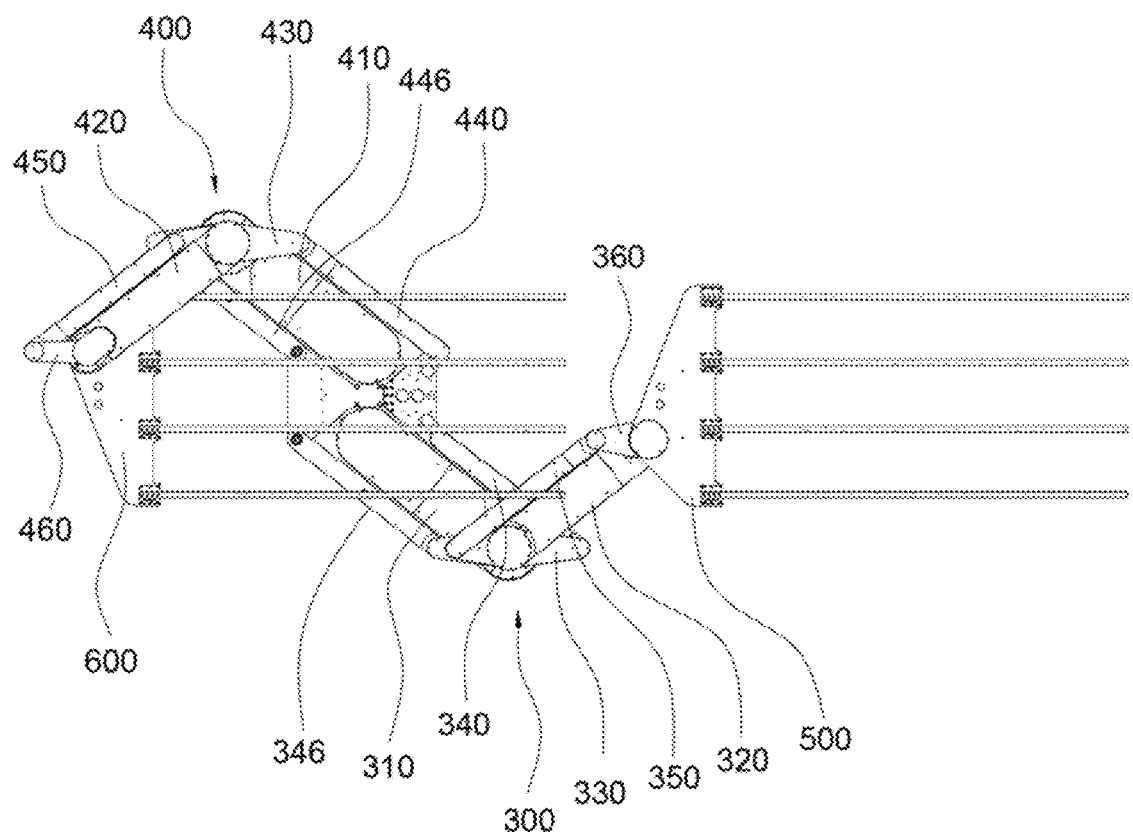

FIG. 3 and FIG. 4 are drawings schematically illustrating a substrate transfer robot in accordance with one example embodiment of the present disclosure.

Hereinafter, expressions "coupled with" and "engaged with" are used interchangeably to explain configurations where two components are combined, or combined to be moved together, within the travel robot, between the travel robot and the substrate transfer robot, or within the substrate transfer robot, according to corresponding explanations where the respective expressions are used.

By referring to FIG. 3 and FIG. 4, the substrate transfer robot 1000 may include a transfer arm platform 200 engaged with a support shaft 101 formed on a transfer robot coupling part of a lower support 100, and may include a first transfer arm part 300 and a second transfer arm part 400 that are engaged with the transfer arm platform 200. Herein, the first transfer arm part 300 and the second transfer arm part 400 may be respectively engaged with a first end effector 500 and a second end effector 600 for supporting a substrate.

Through this, in a state where the first end effector 500 or the second end effector 600 is positioned at a loading position of the substrate or an unloading position of the substrate by a vertical movement of the lower support 100 of the substrate transfer robot 1000 at a set location within a vacuum chamber, the first end effector 500 or the second end effector 600 may load or unload the substrate by operations of the first transfer arm part 300 or the second transfer arm part 400.

Herein, the lower support 100 may include an elevating part that enables a vertical movement and a rotational movement of the substrate transfer robot 1000, and a vertical position of the substrate transfer robot 1000 may be adjusted by an operation of the elevating part so that the substrate transfer robot 1000 is positioned at an appropriate height for loading or unloading the substrate onto or from a process chamber and the like.

In addition, as the case may be, the lower support 100 may further include a travel robot that is coupled with an upper region of the elevating part, and the travel robot may move the substrate transfer robot 1000 supported thereon in a set direction. Herein, the travel robot may seal a hollow formed in an elevating drive shaft of the elevating part from its inside, and an inner line formed by the hollow of the elevating drive shaft may be connected to the support shaft that supports the substrate transfer robot 1000.

First, the transfer arm platform 200 may be connected with the lower support 100.

Figure 5A:
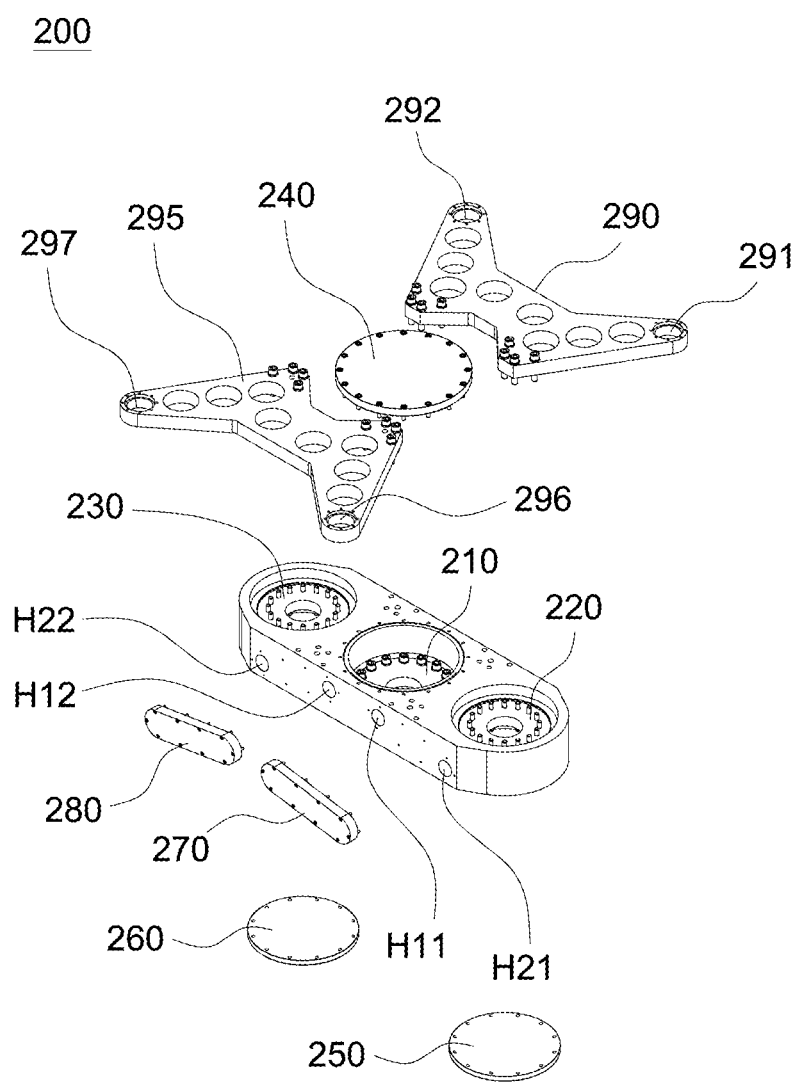
FIG. 5A to FIG. 5C are drawings schematically illustrating a transfer arm platform of the substrate transfer robot in accordance with one example embodiment of the present disclosure.
Figure 5B:
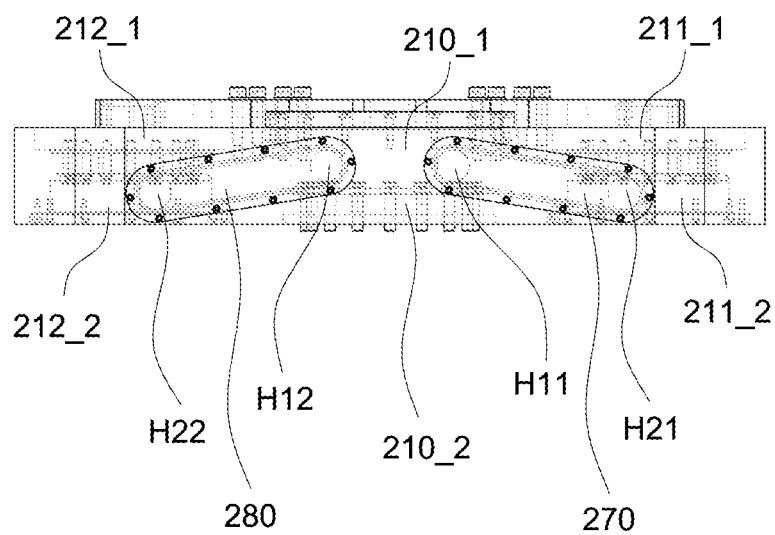

Herein, by referring to FIG. 5A and FIG. 5B, the transfer arm platform 200 may include a first coupling hole 210 formed at a first center area, a second coupling hole 220 formed at a first one-end area, and a third coupling hole 230 formed at a first opposite-end area.

The first coupling hole 210 at the first center area may be compartmentalized into a first upper space 210_1 and a first lower space 210_2 by a first locking member that has a first through-hole corresponding to a hollow of the support shaft 101 of the lower support 100, and the first upper space 210_1 may be sealed by a first cover 240.

In addition, the second coupling hole 220 at the first one-end area may be compartmentalized into a second upper space 211_1 and a second lower space 211_2 by a second locking member that has a second through-hole, and the second lower space 211_2 is sealed by a second cover 250.

Further, the third coupling hole 230 at the first opposite-end area may be compartmentalized into a third upper space 212_1 and a third lower space 212_2 by a third locking member that has a third through-hole, and the third lower space 212_2 may be sealed by a third cover 260.

Also, the transfer arm platform 200 may have a first link connecting member 290 including a (1_1)-st blade 291 and a (1_2)-nd blade 292 for link connection that is fixedly engaged at its front area. Herein, a direction of the front area may be a direction of a processing chamber from the substrate transfer robot 1000 when the substrate transfer robot 1000 is positioned to transfer the substrate to the processing chamber coupled with the vacuum chamber. Also, the transfer arm platform 200 may have a second link connecting member 295 including a (2_1)-st blade 296 and a (2_2)-nd blade 297 for link connection is fixedly engaged at a rear area corresponding to the front area. Herein, the first link connecting member 290 and the second link connecting member 295 may be made up of a single plate or different plates.

Also, the transfer arm platform 200 may be engaged with the lower support 100, and more specifically, the support shaft 101 of the lower support 100 may be inserted into the first lower space 210_2 of the first coupling hole 210 so that the support shaft 101 is fixedly engaged with the first locking member. Herein, when the support shaft 101 is fixedly engaged with the first locking member, sealing at a coupling area between the support shaft 101 and the first locking member may be improved by adding sealing members such as an O-ring, a gasket, etc. Since the configuration of adding the sealing members, such as the O-ring, the gasket, etc., may be similarly applied to other coupling parts to be described hereinafter, a description thereof is omitted in the following description of the present disclosure.

Through this, exposure to an external environment through the hollow of the support shaft 101 may be sealed away, at the first coupling hole 210, from a vacuum environment of an inside of the vacuum chamber.

Meanwhile, wiring holes for introducing wirings that are inserted through the hollow of the support shaft 101 of the lower support 100 into the first transfer arm part 300 and the second transfer arm part 400 may be formed on the transfer arm platform 200.

That is, a (1_1)-st wiring hole H11 and a (1_2)-nd wiring hole H12, each bridging the first upper space 210_1 and one side of a body of the transfer arm platform 200 may be formed. Also, a (2_1)-st wiring hole H21, bridging the second lower space 211_2 and the one side of the body of the transfer arm platform 200, and a (2_2)-nd wiring hole H22, bridging the third lower space 212_2 and the one side of the body of the transfer arm platform 200, may be formed.

In addition, for sealing the wiring holes, a first sealing cover 270 that seals the (1_1)-st wiring hole H11 and the (2_1)-st wiring hole H21 at the one side of the body of the transfer arm platform 200 and a second sealing cover 280 that seals the (1_2)-nd wiring hole H12 and the (2_2)-nd wiring hole H22 at the one side of the body of the transfer arm platform 200 may be provided.

Figure 5C:
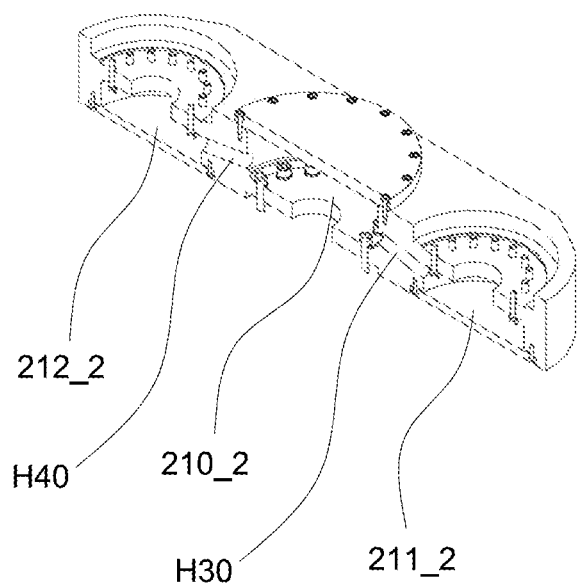

Further, by referring to FIG. 5C, the wiring holes for introducing the wirings that are inserted through the hollow of the support shaft 101 of the lower support 100 into the first transfer arm part 300 and the second transfer arm part 400 may also be formed inside the transfer arm platform 200.

That is, within the body of the transfer arm platform 200, a first wiring hole H30, bridging the first upper space 210_1 and the second lower space 211_2, and a second wiring hole H40, bridging the first upper space 210_1 and the third lower space 212_2, may be formed so that the inside of the transfer arm platform 200 is sealed without using additional sealing members.

Next, by referring to FIG. 3 and FIG. 4 again, a (1_1)-st transfer link arm 310 of the first transfer arm part 300 may be engaged with the transfer arm platform 200 at the second coupling hole 220 of the transfer arm platform 200. Also, a (2_1)-st transfer link arm 410 of the second transfer arm part 400 may be engaged with the transfer arm part platform 200 at the third coupling hole 230 of the transfer arm platform 200.

Figure 6:
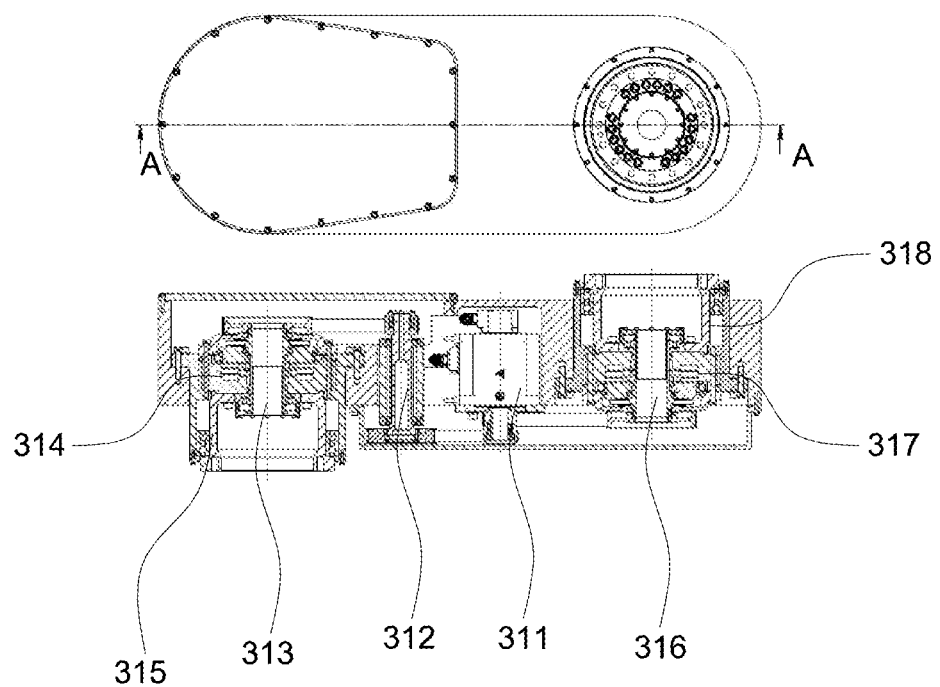
FIG. 6 is a drawing schematically illustrating a (1_1)-st transfer link arm of the substrate transfer robot in accordance with one example embodiment of the present disclosure.

Herein, by referring to FIG. 6, the (1_1)-st transfer link arm 310 of the first transfer arm part 300 may have a sealed inner space, and a first transfer driving motor 311 and a first speed reducer 312, interlocked with the first transfer driving motor 311 to reduce a rotational speed of the first transfer driving motor 311 by half, may be installed in the sealed inner space of the (1_1)-st transfer link arm 310.

Also, a (1_1)-st drive shaft 313, having a hollow formed therein and interlocked with the first speed reducer 312, and a (1_1)-st output shaft 314 interlocked with the (1_1)-st drive shaft 313 may be sealingly installed on a (1_1)-st one-end area of the (1_1)-st transfer link arm 310. Further, a (1_2)-nd drive shaft 316, having a hollow formed therein and interlocked with the first transfer driving motor 311, and a (1_2)-nd output shaft 317 interlocked with the (1_2)-nd drive shaft 316 may be sealingly installed on a (1_1)-st opposite-end area of the (1_1)-st transfer link arm 310. Herein, the interlocking between the first transfer driving motor 311 and the first speed reducer 312, the interlocking between the first speed reducer 312 and the (1_1)-st drive shaft 313 and the interlocking between the first transfer driving motor 311 and the (1_2)-nd drive shaft 316 may be respectively achieved by using a pulley method, but the present disclosure is not limited thereto, and various methods, such as a gear method, etc., may be used for transmitting rotational force. Also, the (1_1)-st drive shaft 313 and the (1_1)-st output shaft 314, and the (1_2)-nd drive shaft 316 and the (1_2)-nd output shaft 317 may each be formed with a speed reducer having a same speed reduction ratio with each other. Adding to this, the (1_1)-st output shaft 314 and the (1_2)-nd output shaft 317 may rotate in opposite directions from each other.

Further, the (1_1)-st output shaft 314 that is installed at the (1_1)-st one-end area of the (1_1)-st transfer link arm 310 of the first transfer arm part 300 may be inserted into the second upper space 211_1 of the second coupling hole 220 of the transfer arm platform 200 so as to be fixedly engaged with the second locking member.

Herein, a first linking member 315 may be used for coupling the (1_1)-st output shaft 314 and the second locking member, wherein the first linking member 315 may be a tube-shaped shaft having its length extended by a distance between the first output shaft 314 and the second locking member at a location where the transfer arm platform 200 and the (1_1)-st transfer link arm 310 are coupled, and both ends of the first linking member 315 may be fixedly coupled with the (1_1)-st output shaft 314 and the second locking member respectively.

Also, the (1_2)-nd output shaft 317 of the (1_1)-st transfer link arm 310 of the first transfer arm part 300 may be fixedly engaged with a (1_2)-nd one-end area of a (1_2)-nd transfer link arm 320.

Figure 7:
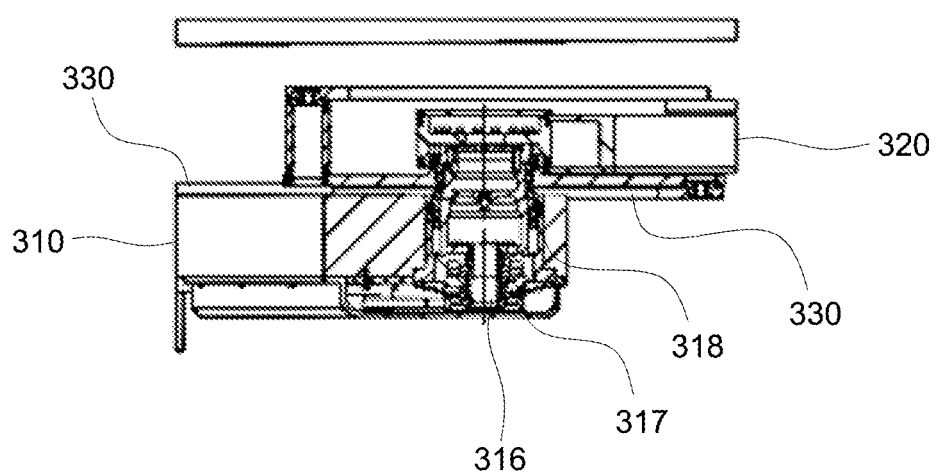
FIG. 7 is a drawing schematically illustrating a connecting part between the (1_1)-st transfer link arm and a (1_2)-nd transfer link arm of the substrate transfer robot in accordance with one example embodiment of the present disclosure.

Herein, by referring to FIG. 7, a first fixed coupling shaft 318 may be used for coupling the (1_2)-nd output shaft 317 and the (1_2)-nd one-end area, wherein the first fixed coupling shaft 318 may be a tube-shaped shaft having its length extended by a distance between the (1_2)-nd output shaft 317 and a coupling region of the (1_2)-nd one-end area to be connected to the (1_2)-nd output shaft 317 at a location where the (1_1)-st transfer link arm 310 and the (1_2)-nd transfer link arm 320 are coupled, and both ends of the first fixed coupling shaft 318 may be fixedly coupled with the (1_2)-nd output shaft 317 and the coupling region of the (1_2)-nd one-end area respectively.

In addition, a first common link arm 330 may be installed at a location where the (1_2)-nd output shaft 317 and the (1_2)-nd one-end area are coupled.

That is, a second center area of the first common link arm 330 may be rotatably engaged with the first fixed coupling shaft 318 that couples the (1_2)-nd output shaft 317 and the (1_2)-nd one-end area.

Also, by referring to FIG. 3 and FIG. 4 again, the first transfer arm part 300 may include a (1_1)-st subordinate link arm 340 that is in parallel with the (1_1)-st transfer link arm 310, wherein a (1_4)-th one-end area of the (1_1)-st subordinate link arm 340 may be rotatably engaged with the (1_1)-st blade 291 of the first link connecting member 290 of the transfer arm platform 200, and a (1_4)-th opposite-end area of the (1_1)-st subordinate link arm 340 may be rotatably engaged with a (1_3)-rd one-end area of the first common link arm 330.

In addition, the first transfer arm part 300 may include a (1_2)-nd subordinate link arm 346 that is in parallel with the (1_1)-st transfer link arm 310, wherein a (1_5)-th one-end area of the (1_2)-nd subordinate link arm 346 may be rotatably engaged with the (2_1)-st blade 296 of the second link connecting member 295 of the transfer arm platform 200, and a (1_5)-th opposite-end area of the (1_2)-nd subordinate link arm 346 may be rotatably engaged with a (1_3)-rd opposite-end area of the first common link arm 330.

Through this, a double parallel link structure is made up of two parallel links, each having a parallelogram structure. Herein, the two parallel links are formed side-by-side on the (1_1)-st transfer link arm 310 by sharing one side of each parallelogram structure on the (1_1)-st transfer link arm 310 and forming three sides of each parallelogram structure at either side of the shared side on the (1_1)-st transfer link arm 310.

Herein, one of the two single parallel links may be made up of (i) a frame configured as a joint to which the (1_1)-st one-end area of the (1_1)-st transfer link arm 310 and the second coupling hole 220 of the transfer arm platform 200 are linked and a joint to which the (1_4)-th one-end area of the (1_1)-st subordinate link arm 340 and the (1_1)-st blade 291 of the first link connecting member 290 are linked, (ii) an input link configured as the (1_1)-st transfer link arm 310, (iii) a connecting arm configured as a region of the first common link arm 330 between a joint to which the (1_1)-st opposite-end area of the (1_1)-st transfer link arm 310 and the second center area of the first common link arm 330 are linked and a joint to which the (1_3)-rd one-end area of the first common link arm 330 and the (1_4)-th opposite-end area of the (1_1)-st subordinate link arm 340 are linked and (iv) a follower configured as the (1_1)-st subordinate link arm 340.

Also, the other single parallel link may be made up of (i) a frame configured as the joint to which the (1_1)-st one-end area of the (1_1)-st transfer link arm 310 and the second coupling hole 220 of the transfer arm platform 200 are linked and a joint to which the (1_5)-th one-end area of the (1_2)-nd subordinate link arm 346 and the (2_1)-st blade 296 of the second link connecting member 295 are linked, (ii) an input link configured as the (1_1)-st transfer link arm 310, (iii) a connecting arm configured as a region of the first common link arm 330 between the joint to which the (1_1)-st opposite-end area of the (1_1)-st transfer link arm 310 and the second center area of the first common link arm 330 are linked and a joint to which the (1_3)-rd opposite-end area of the first common link arm 330 and the (1_5)-th opposite-end area of the (1_2)-nd subordinate link arm 346 are linked and (iv) a follower configured as the (1_2)-nd subordinate link arm 346.

Additionally, the first transfer arm part 300 may include a (1_3)-rd subordinate link arm 350 that is in parallel with the (1_2)-nd transfer link arm 320, wherein a (1_6)-th one-end area of the (1_3)-rd subordinate link arm 350 may be rotatably engaged with the (1_3)-rd opposite-end area of the first common link arm 330. Herein, a joint, to which the (1_6)-th one-end area of the (1_3)-rd subordinate link arm 350 and the (1_3)-rd opposite-end area of the first common link arm 330 are linked, may be formed at a location same as or different from a location of a joint, to which the (1_5)-th opposite-end area of the (1_2)-nd subordinate link arm 346 and the (1_3)-rd opposite-end area of the first common link arm 330 are linked.

Further, the first transfer arm part 300 may include a (1_4)-th subordinate link arm 360 that is in parallel with the first common link arm 330, wherein a (1_7)-th one-end area of the (1_4)-th subordinate link arm 360 may be rotatably engaged with a (1_6)-th opposite-end area of the (1_3)-rd subordinate link arm 350, and a (1_7)-th opposite-end area of the (1_4)-th subordinate link arm 360 may be rotatably engaged with a (1_2)-nd opposite-end area of the (1_2)-nd transfer link arm 320.

Also, the first transfer arm part 300 may include the first end effector 500, and the first end effector 500 may be fixed to the (1_7)-th opposite-end area of the (1_4)-th subordinate link arm 360 to thereby support the substrate.

The first transfer arm part 300 configured as above may make the first end effector 500 move forward and backward along a straight line by each of the transfer arms and the subordinate arms according to an operation of the first transfer driving motor 311. Accordingly, the substrate may be loaded or unloaded at a position set by the first end effector 500.

Meanwhile, the second transfer arm part 400 may be configured similarly as the first transfer arm part 300, and the first transfer arm part 300 and the second transfer arm part 400 may be installed on the transfer arm platform 200 so as to be symmetrical to each other with respect to a central region of the transfer arm platform 200.

That is, the (2_1)-st transfer link arm 410 of the second transfer arm part 400 may have a sealed inner space, and a second transfer driving motor and a second speed reducer, interlocked with the second transfer driving motor to reduce a rotational speed of the second transfer driving motor by half, may be installed in the sealed inner space of the (2_1)-st transfer link arm 410.

Also, a (2_1)-st drive shaft, having a hollow formed therein and interlocked with the second speed reducer, and a (2_1)-st output shaft interlocked with the (2_1)-st drive shaft may be sealingly installed on a (2_1)-st one-end area of the (2_1)-st transfer link arm 410. Further, a (2_2)-nd drive shaft, having a hollow formed therein and interlocked with the second transfer driving motor, and a (2_2)-nd output shaft interlocked with the (2_2)-nd drive shaft may be sealingly installed on a (2_1)-st opposite-end area of the (2_1)-st transfer link arm 410. Herein, the interlocking between the second transfer driving motor and the second speed reducer, the interlocking between the second speed reducer and the (2_1)-st drive shaft and the interlocking between the second transfer driving motor and the (2_2)-nd drive shaft may be respectively achieved by using the pulley method, but the present disclosure is not limited thereto, and various methods, such as the gear method, etc., may be used for transmitting rotational force. Also, the (2_1)-st drive shaft and the (2_1)-st output shaft, and the (2_2)-nd drive shaft and the (2_2)-nd output shaft may each be formed with a speed reducer having a same speed reduction ratio with each other. Adding to this, the (2_1)-st output shaft and the (2_2)-nd output shaft may rotate in opposite directions from each other.

Further, the (2_1)-st output shaft that is installed at the (2_1)-st one-end area of the (2_1)-st transfer link arm 410 of the second transfer arm part 400 may be inserted into the third upper space 212_1 of the third coupling hole 230 of the transfer arm platform 200 so as to be fixedly engaged with the third locking member.

Herein, a second linking member may be used for coupling the (2_1)-st output shaft and the third locking member, wherein the second linking member may be a tube-shaped shaft having its length extended by a distance between the (2_1)-st output shaft and the third locking member at a location where the transfer arm platform 200 and the (2_1)-st transfer link arm 410 are coupled, and both ends of the second linking member may be fixedly coupled with the (2_1)-st output shaft and the third locking member respectively.

Also, the (2_2)-nd output shaft of the (2_1)-st transfer link arm 410 of the second transfer arm part 400 may be fixedly engaged with a (2_2)-nd one-end area of a (2_2)-nd transfer link arm 420.

Herein, a second fixed coupling shaft may be used for coupling the (2_2)-nd output shaft and the (2_2)-nd one-end area, wherein the second fixed coupling part may be a tube-shaped shaft having its length extended by a distance between the (2_2)-nd output shaft and a coupling region of the (2_2)-nd one-end area to be connected to the (2_2)-nd output shaft at a location where the (2_1)-st transfer link arm 410 and the (2_2)-nd transfer link arm 420 are coupled, and both ends of the second fixed coupling shaft may be fixedly coupled with the (2_2)-nd output shaft and the coupling region of the (2_2)-nd one-end area respectively.

In addition, a second common link arm 430 may be installed at a location where the (2_2)-nd output shaft and the (2_2)-nd one-end area are coupled.

That is, a third center area of the second common link arm 430 may be rotatably engaged with the second fixed coupling shaft that couples the (2_2)-nd output shaft and the (2_2)-nd one-end area.

Also, the second transfer arm part 400 may include a (2_1)-st subordinate link arm 440 that is in parallel with the (2_1)-st transfer link arm 410, wherein a (2_4)-th one-end area of the (2_1)-st subordinate link arm 440 may be rotatably engaged with the (1_2)-nd blade 292 of the first link connecting member 290 of the transfer arm platform 200, and a (2_4)-th opposite-end area of the (2_1)-st subordinate link arm 440 may be rotatably engaged with a (2_3)-rd one-end area of the second common link arm 430.

In addition, the second transfer arm part 400 may include a (2_2)-nd subordinate link arm 446 that is in parallel with the (2_1)-st transfer link arm 410, wherein a (2_5)-th one-end area of the (2_2)-nd subordinate link arm 446 may be rotatably engaged with the (2_2)-nd blade 297 of the second link connecting member 295 of the transfer arm platform 200, and a (2_5)-th opposite-end area of the (2_2)-nd subordinate link arm 446 may be rotatably engaged with a (2_3)-rd opposite-end area of the second common link arm 430.

Through this, a double parallel link structure is made up of two parallel links, each having a parallelogram structure. Herein, the two parallel links are formed side-by-side on the (2_1)-st transfer link arm 410 by sharing one side of each parallelogram structure on the (2_1)-st transfer link arm 410 and forming three sides of each parallelogram structure at either side of the shared side on the (2_1)-st transfer link arm 410.

Herein, one of the two single parallel links may be made up of (i) a frame configured as a joint to which the (2_1)-st one-end area of the (2_1)-st transfer link arm 410 and the third coupling hole 230 of the transfer arm platform 200 are linked and a joint to which the (2_4)-th one-end area of the (2_1)-st subordinate link arm 440 and the (1_2)-nd blade 292 of the first link connecting member 290 are linked, (ii) an input link configured as the (2_1)-st transfer link arm 410, (iii) a connecting arm configured as a region of the second common link arm 430 between a joint to which the (2_1)-st opposite-end area of the (2_1)-st transfer link arm 410 and the third center area of the second common link arm 430 are linked and a joint to which the (2_3)-rd one-end area of the second common link arm 430 and the (2_4)-th opposite-end area of the (2_1)-st subordinate link arm 440 are linked and (iv) a follower configured as the (2_1)-st subordinate link arm 440.

Also, the other single parallel link may be made up of (i) a frame configured as the joint to which the (2_1)-st one-end area of the (2_1)-st transfer link arm 410 and the third coupling hole 230 of the transfer arm platform 200 are linked and a joint to which the (2_5)-th one-end area of the (2_2)-nd subordinate link arm 446 and the (2_2)-nd blade 297 of the second link connecting member 295 are linked, (ii) an input link configured as the (2_1)-st transfer link arm 410, (iii) a connecting arm configured as a region of the second common link arm 430 between the joint to which the (2_1)-st opposite-end area of the (2_1)-st transfer link arm 410 and the third center area of the second common link arm 430 are linked and a joint to which the (2_3)-rd opposite-end area of the second common link arm 430 and the (2_5)-th opposite-end area of the (2_2)-nd subordinate link arm 446 are linked and (iv) a follower configured as the (2_2)-nd subordinate link arm 446.

Additionally, the second transfer arm part 400 may include a (2_3)-rd subordinate link arm 450 that is in parallel with the (2_2)-nd transfer link arm 420, wherein a (2_6)-th one-end area of the (2_3)-rd subordinate link arm 450 may be rotatably engaged with the (2_3)-rd opposite-end area of the second common link arm 430. Herein, a joint, to which the (2_6)-th one-end area of the (2_3)-rd subordinate link arm 450 and the (2_3)-rd opposite-end area of the second common link arm 430 are linked, may be formed at a location same as or different from a location of a joint, to which the (2_5)-th opposite-end area of the (2_2)-nd subordinate link arm 446 and the (2_3)-rd opposite-end area of the second common link arm 430 are linked.

Further, the second transfer arm part 400 may include a (2_4)-th subordinate link arm 460 that is in parallel with the second common link arm 430, wherein a (2_7)-th one-end area of the (2_4)-th subordinate link arm 460 may be rotatably engaged with a (2_6)-th opposite-end area of the (2_3)-rd subordinate link arm 450, and a (2_7)-th opposite-end area of the (2_4)-th subordinate link arm 460 may be rotatably engaged with a (2_2)-nd opposite-end area of the (2_2)-nd transfer link arm 420.

Also, the second transfer arm part 400 may include the second end effector 600, and the second end effector 600 may be fixed to the (2_7)-th opposite-end area of the (2_4)-th subordinate link arm 460 to thereby support the substrate.

The second transfer arm part 400 configured as above may make the second end effector 600 move forward and backward along a straight line by each of the transfer arms and the subordinate arms according to an operation of the second transfer driving motor. Accordingly, the substrate may be loaded or unloaded at a position set by the second end effector 600.

Herein, the (1_1)-st opposite-end area of the (1_1)-st transfer link arm 310 of the first transfer arm part 300 and the (2_1)-st opposite-end area of the (2_1)-st transfer link arm 410 of the second transfer arm part 400 may be identically located at the front area or the rear area of the transfer arm platform 200.

Also, unlike this, the (1_1)-st opposite-end area of the (1_1)-st transfer link arm 310 of the first transfer arm part 300 may be located at the front area of the transfer arm platform 200, while the (2_1)-st opposite-end area of the (2_1)-st transfer link arm 410 of the second transfer arm part 400 may be located at the rear area of the transfer arm platform 200.

In addition, a height of the second fixed coupling shaft, coupling the (2_1)-st transfer link arm 410 of the second transfer arm part 400 and the (2_2)-nd transfer link arm 420 of the second transfer arm part 400, may be set as higher than a height of the first fixed coupling shaft 318, coupling the (1_1)-st transfer link arm 310 of the first transfer arm part 300 and the (1_2)-nd transfer link arm 320 of the first transfer arm part 300, such that the first end effector 500 of the first transfer arm part 300 and the second end effector 600 of the second transfer arm part 400 may be positioned at different heights during operations of the first end effector 500 and the second end effector 600.

Further, the second common link arm 430 that couples the (2_1)-st transfer link arm 410 of the second transfer arm part 400 and the (2_2)-nd transfer link arm 420 of the second transfer arm part 400 may include a hollow tube, corresponding to the height of the second fixed coupling shaft and having a hollow formed therein for inserting the second fixed coupling shaft therein. Herein, a third blade including the (2_3)-rd one-end area may be fixedly coupled with a lower area of the hollow tube and a fourth blade including the (2_3)-rd opposite-end area may be fixedly coupled with an upper area of the hollow tube. Also, the (2_3)-rd one-end area and the (2_3)-rd opposite-end area with respect to a central axis of the hollow tube may lie symmetrically on each side of the central axis of the hollow tube when viewed from the central axis of the hollow tube.

In addition, a first wiring for an operation of the first transfer driving motor 311 and a second wiring for an operation of the second transfer driving motor may be respectively disposed in an enclosed space inside the substrate transfer robot 1000.

Herein, the first wiring may be fed into the first transfer driving motor 311 through the hollow of the support shaft 101 of the lower support 100 and the hollow of the (1_1)-st drive shaft 313 so as to prevent the first wiring from being exposed to the inner space of the vacuum chamber. Also, the second wiring may be fed into the second transfer driving motor through the hollow of the support shaft 101 of the lower support 100 and the hollow of the (2_1)-st drive shaft so as to prevent the second wiring from being exposed to the inner space of the vacuum chamber. Meanwhile, the first wiring and the second wiring may be respectively branched from the support shaft 101 into the first transfer arm part 300 and the second transfer arm part 400 through a wiring hole formed at the transfer arm platform 200.

In the configuration explained above, the height of the second fixed coupling shaft, coupling the (2_1)-st transfer link arm 410 of the second transfer arm part 400 and the (2_2)-nd transfer link arm 420 of the second transfer arm part 400, is set as higher than the height of the first fixed coupling shaft 318, coupling the (1_1)-st transfer link arm 310 of the first transfer arm part 300 and the (1_2)-nd transfer link arm 320 of the first transfer arm part 300, such that the first end effector 500 of the first transfer arm part 300 and the second end effector 600 of the second transfer arm part 400 are positioned at different heights during the operations of the first end effector 500 and the second end effector 600. In this way, the first transfer arm part 300 may operate as a lower transfer arm and the second transfer arm part 400 may operate as an upper transfer arm, but on the contrary to this, it may also be possible according to another example embodiment of the present disclosure that the height of the first fixed coupling shaft 318 of the first transfer arm part 300 and the height of the second fixed coupling shift of the second transfer arm part 400 may be set as same with each other so that the first transfer arm part 300 and the second transfer arm part 400 have a same height.

In other words, the first transfer arm part 300 and the second transfer arm part 400 may be formed in a same shape, but to be symmetrical with other, so that installation heights of the first transfer arm part 300 and the second transfer arm part 400 become lowered.

In addition, since the installation heights of the first transfer arm part 300 and the second transfer arm part 400 can be lowered, a height of a transfer chamber in which the substrate transfer robot is located can also be lowered as a result. Also, lowering the height of the transfer chamber can reduce an inner space of the transfer chamber, and thus may also be possible to improve a vacuum performance of the transfer chamber.

Figure 8:
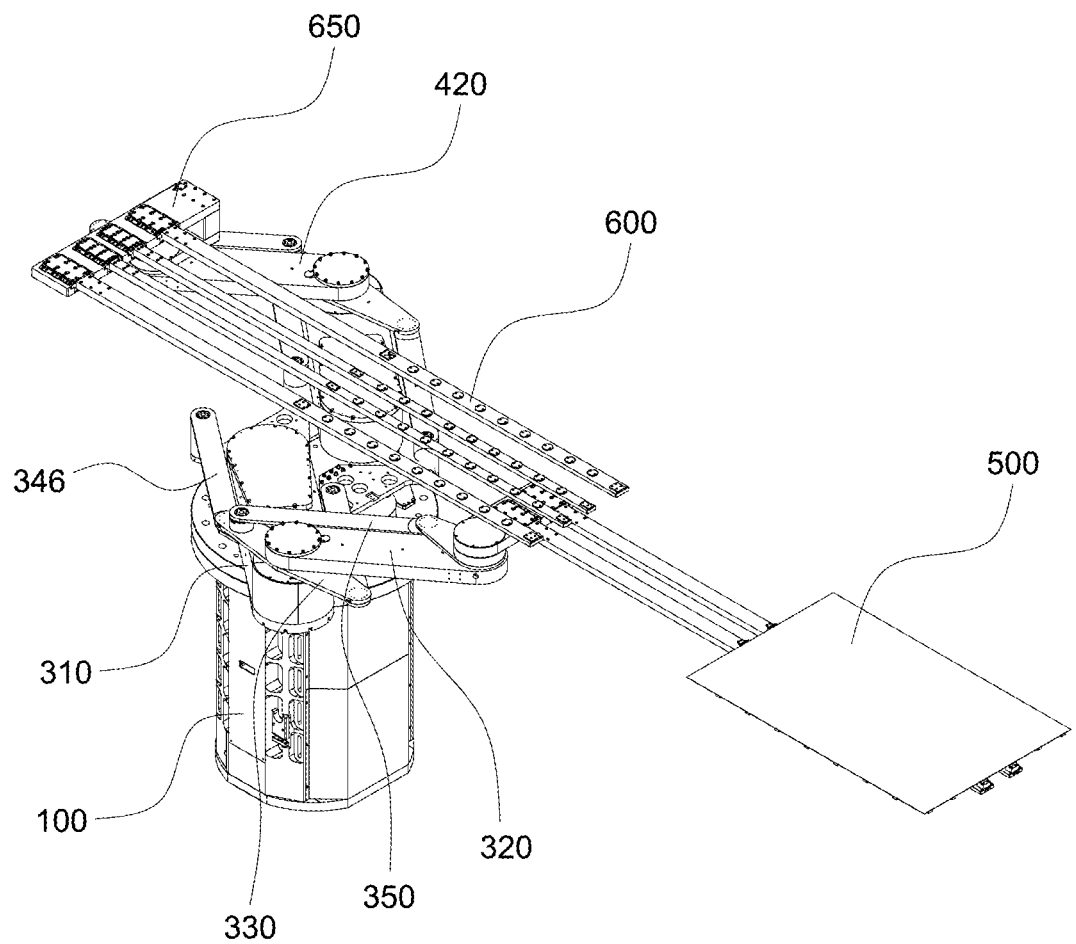
FIG. 8 and FIG. 9 are drawings schematically illustrating a substrate transfer robot in accordance with another example embodiment of the present disclosure.
Figure 9:
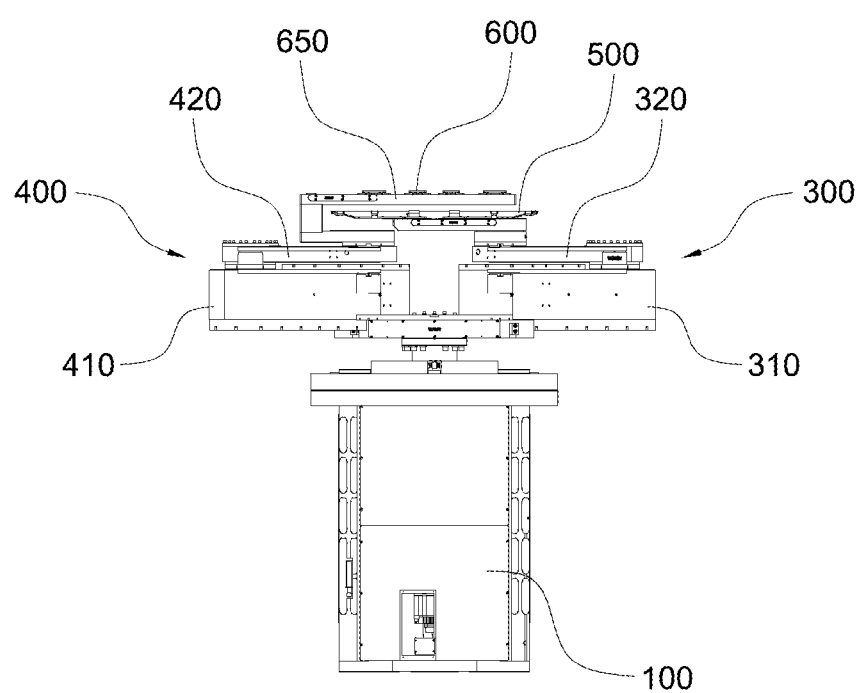

This is described in more detail with reference to FIG. 8 and FIG. 9 as follows. For convenience of understanding, same reference numerals as FIG. 3 to FIG. 7 are applied to FIG. 8 and FIG. 9 for identical parts. In the following description, detailed explanation of parts that can be easily understood from the description provided by referring to FIG. 3 to FIG. 7 are omitted.

The (1_2)-nd transfer link arm 320 of the first transfer arm part 300 may be fixedly engaged with the (1_2)-nd output shaft of the (1_1)-st transfer link arm 310 of the first transfer arm part 300 through the first fixed coupling shaft. Also, the (2_2)-nd transfer link arm 420 of the second transfer arm part 400 may be fixedly engaged with the (2_2)-nd output shaft of the (2_1)-st transfer link arm 410 of the second transfer arm part 400 through the second fixed coupling shaft.

Herein, by forming the first fixed coupling shaft and the second fixed coupling shaft to have a same height, installation heights of the (1_2)-nd transfer link arm 320 of the first transfer arm part 300 and the (2_2)-nd transfer link arm 420 of the second transfer arm part 400 may be formed to have a same height.

That is, the (1_1)-st transfer link arm 310 and the (1_2)-nd transfer link arm 320 of the first transfer arm part 300 and the (2_1)-st transfer link arm 410 and the (2_2)-nd transfer link arm 420 of the second transfer arm part 400 may be installed at a same height and be formed symmetrical to each other.

Also, while the first end effector 500 of the first transfer arm part 300 is fixedly engaged with the (1_7)-th opposite-end area of the (1_4)-th subordinate link arm, the second end effector 600 of the second transfer arm part 400 may be fixedly engaged with the (2_7)-th opposite end area of the (2_4)-th subordinate link arm through a bracket 650 so that the second end effector 600 is at a different height from the first end effector 500. Herein, the bracket 650 may be formed in a " ㄷ " shape, but the present disclosure is not limited thereto. For reference, " ㄷ " is a Korean alphabet.

Accordingly, the first end effector 500 of the first transfer arm 300 and the second end effector 600 of the second transfer arm 400 may be separated by a distance between an upper surface and a lower surface of the bracket 650, and thus support the substrates at different heights.

Also, when the substrates are being transferred by the operations of the first transfer arm part 300 and the second transfer arm part 400, the first end effector 500 or the substrate supported by the first end effector 500 may be moved through a space in-between the upper surface and the lower surface of the bracket 650 to thereby prevent any interference between the first end effector 500 and the second end effector 600 and prevent any collisions between the first end effector 500 and the second transfer arm part 400 and collisions between the second end effector 600 and the first transfer arm part 300.

By forming a region of the (1_1)-st transfer link arm 310 of the first transfer arm 300 and a region of the (2_1)-st transfer link arm 410 of the second transfer arm 400 into the double parallel link structure in accordance with one example embodiment of the present disclosure, vibrations and disturbances of the first end effector 500 and the second end effector 600 on a path for the substrate transfer are minimized.

Figure 10A:
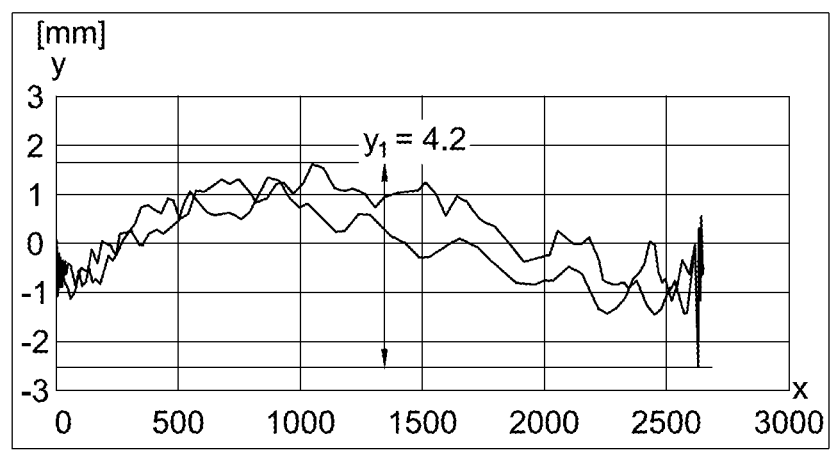
FIG. 10A is test data obtained by measuring path accuracy of the conventional substrate transfer robot.
Figure 10B:
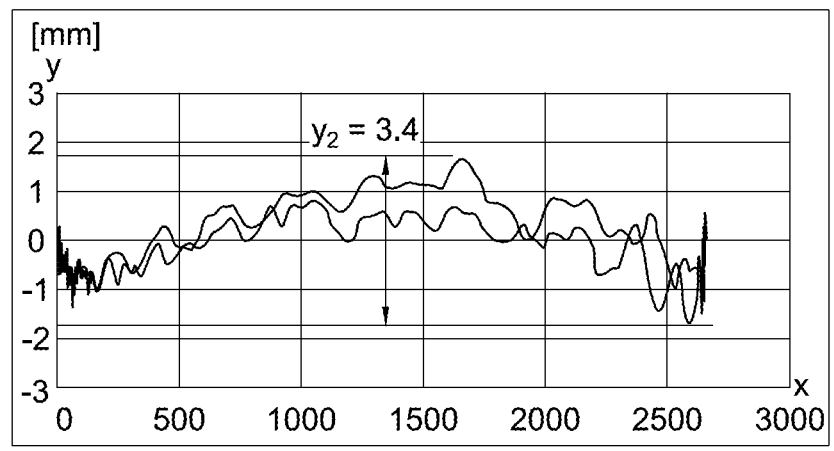
FIG. 10B is test data obtained by measuring path accuracy of the substrate transfer robot configured in accordance with one example embodiment of the present disclosure.

This may be explained with test data in FIG. 10A and FIG. 10B obtained by measuring path accuracy of a conventional substrate transfer robot and path accuracy of the substrate transfer robot configured in accordance with one example embodiment of the present disclosure.

In each graph of FIG. 10A and FIG. 10B, the x-axis represents a transfer distance of transferring the substrate, the y-axis represents a vibration distance of an end effector, in other words, the vibration distance in a direction orthogonal to a movement path of the end effector. Herein, scales of both distances are given in the unit of mm.

Herein, the graph in FIG. 10A is obtained by measuring the movement path of the end effector of the conventional substrate transfer and the graph in FIG. 10B is obtained by measuring the movement path of the end effector of the substrate transfer robot configured in accordance with one example embodiment of the present disclosure.

By comparing the graphs in FIG. 10A and FIG. 10B, it is observed that while the vibration distance $y_1$ measured for the conventional substrate robot along its entire movement path is 4.2 mm, the vibration distance $y_2$ measured for the substrate transfer robot configured in accordance with one example embodiment of the present disclosure along its entire movement path is 3.4 mm. This indicates that the vibration distance $y_2$ measured for the substrate transfer robot of the present disclosure is reduced in comparison to the vibration distance $y_1$ measured for the conventional substrate robot.

In addition, it is also observable that vibration frequency produced from the movement of the first end effector 500 and/or the second end effector 600 is increased and width of instantaneous vibration is decreased as a result of improving rigidity of the double parallel link structure formed at the (1_1)-st transfer link arm 310 of the first transfer arm 300 and/or the double parallel link structure formed at the (2_1)-st transfer link arm 410 of the second transfer arm 400.

Further, with the double parallel link structure formed at the (1_1)-st transfer link arm 310 of the first transfer arm 300 and/or the double parallel link structure formed at the (2_1)-st transfer link arm 410 of the second transfer arm 400, structural deformation of the first end effector 500 and/or the second end effector 600 is prevented even when the (1_1)-st transfer link arm 310 and/or the (2_1)-st transfer link arm 410 undergoes changes 5 in lengths due to thermal expansion.

Figure 11:
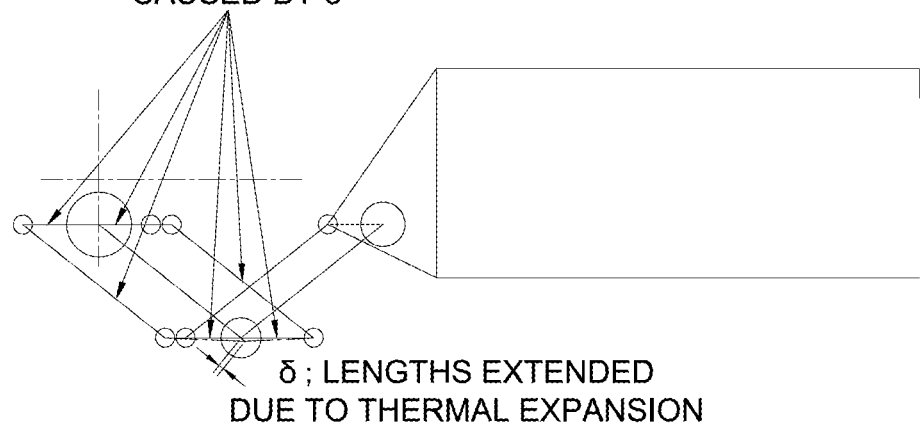
FIG. 11 is a drawing schematically illustrating a changed state of a position of a double parallel link structure caused by thermal expansion of the substrate transfer robot in accordance with one example embodiment of the present disclosure.

That is, by referring to FIG. 11, even when the (1_1)-st transfer link arm 310 and/or the (2_1)-st transfer link arm 410 undergoes the changes 5 in lengths due to the thermal expansion, each link of the double parallel link structure at the (1_1)-st transfer link arm 310 and/or each link of the double parallel link structure at the (2_1)-st transfer link arm 410 undergoes elastic deformation, and this offsets the changes 5 in lengths of the (1_1)-st transfer link arm 310 and/or the (2_1)-st transfer link arm 410 to a certain extent, thus preventing the structural deformation of the first end effector 500 and/or the second end effector 600.

Figure 12A:
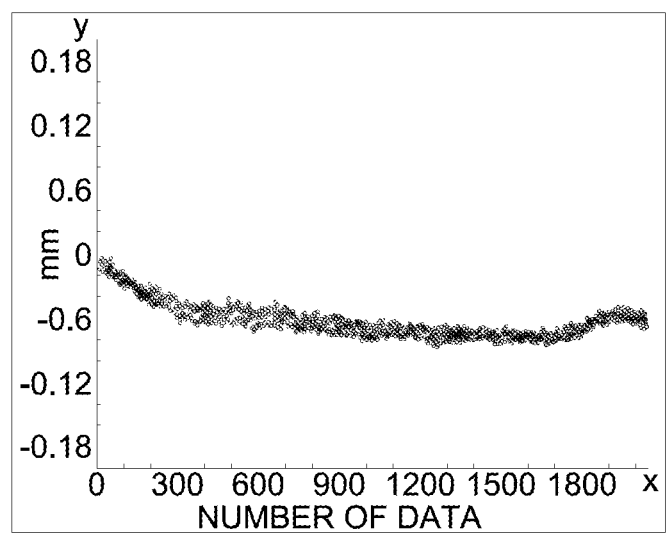
FIG. 12A is test data obtained in long-term repetition by measuring long-term repetition path accuracy of the conventional substrate transfer robot.
Figure 12B:
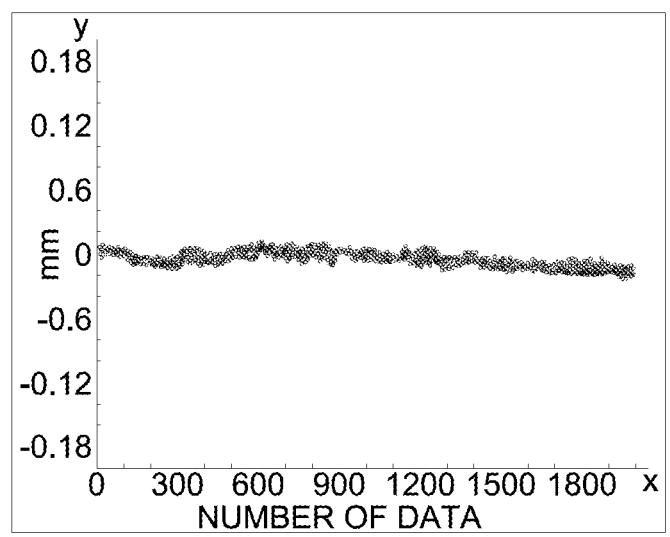
FIG. 12B is test data obtained in long-term repetition by measuring long-term repetition path accuracy of the substrate transfer robot configured in accordance with one example embodiment of the present disclosure.

This may be explained with test data in FIG. 12A and FIG. 12B obtained in long-term repetition by measuring long-term repetition path accuracy of the conventional substrate transfer robot and long-term repetition path accuracy of the substrate transfer robot configured in accordance with one example embodiment of the present disclosure.

In each graph of FIG. 12A and FIG. 12B, the x-axis represents the number of data obtained from repeated substrate transfer operations, and the y-axis represents a magnitude of position change of a tip of the end effector.

Herein, the graph in FIG. 12A is obtained by measuring the magnitude of position change of the tip of the end effector in the conventional substrate transfer and the graph in FIG. 12B is obtained by measuring the magnitude of position change of the tip of the end effector in the substrate transfer robot configured in accordance with one example embodiment of the present disclosure.

By comparing the graphs in FIG. 12A and FIG. 12B, it is observed that the magnitude of position change of the tip of the end effector caused due to the thermal expansion in the substrate transfer robot of the present disclosure is reduced in comparison to the magnitude of position change of the tip of the end effector caused due to the thermal expansion in the conventional substrate transfer robot. This indicates that deformation of the parallelogram structures of the transfer link arms resulting from the changes in lengths of the transfer link arms due to the thermal expansion is suppressed by the double parallel link structure, thus reducing the magnitude of position changes of the end effectors.

Although the transfer of the substrate has been described above, the present disclosure may also be applied to a transfer of masks necessary for processing the substrates.

The present disclosure has an effect of providing the substrate transfer robot with minimal vibrations and minimal disturbances generated on the end effectors by improving rigidity of the first transfer link arm with the double parallel link structure formed by the first transfer link arm.

The present disclosure has another effect of providing the substrate transfer robot capable of preventing changes to positions of the end effectors by using the double parallel link structure formed by the first transfer link arm that prevents structural deformation of the single parallel link of the second transfer link arm caused by thermal expansion of the first transfer link arm.

The present disclosure has still another effect of enabling the substrate transfer robot to transfer the substrate without preliminary operations and thus improving throughput of transferring substrates by preventing the structural deformation of the single parallel link of the second transfer link arm caused by the thermal expansion of the first transfer link arm.

The present disclosure has still another effect of providing the substrate transfer robot of a compact structure by integrating a drive system for transferring the substrate within a transfer link arm.

The present disclosure has still another effect of preventing any generation of particles by having a sealed structure that is completely sealed away within the vacuum chamber.

As seen above, the present disclosure has been explained by specific matters such as detailed components, limited embodiments, and drawings. While the invention has been shown and described with respect to the preferred embodiments, it, however, will be understood by those skilled in the art that various changes and modification may be made without departing from the spirit and scope of the invention as defined in the following claims.

Accordingly, the thought of the present disclosure must not be confined to the explained embodiments, and the following patent claims as well as everything including variations equal or equivalent to the patent claims pertain to the category of the thought of the present disclosure.

What is claimed is:

1. A substrate transfer robot for transferring substrates in a vacuum chamber, comprising:
a transfer arm platform through which a first coupling hole, a second coupling hole and a third coupling hole are formed respectively at a first center area, a first one-end area and a first opposite-end area thereof, wherein a first locking member, through which a first through-hole corresponding to a hollow of a support shaft is formed on a transfer robot coupling part of a lower support, compartmentalizes the first coupling hole into a first upper space sealed by a first cover and a first lower space, wherein a second locking member, through which a second through-hole is formed, compartmentalizes the second coupling hole into a second upper space and a second lower space sealed by a second cover, wherein a third locking member, through which a third through-hole is formed, compartmentalizes the third coupling hole into a third upper space and a third lower space sealed by a third cover, wherein a first link connecting member including a (1_1)-st blade and a (1_2)-nd blade for link connection is fixedly engaged at a front area, with a direction of the front area being a direction of a processing chamber from the substrate transfer robot when the substrate transfer robot is positioned to transfer the substrates to the processing chamber coupled with the vacuum chamber, wherein a second link connecting member including a (2_1)-st blade and a (2_2)-nd blade for link connection is fixedly engaged at a rear area corresponding to the front area, and wherein the support shaft at the lower support inserted into the first lower space is fixedly engaged with the first locking member;

a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_1)-st transfer link arm, a (1_3)-rd subordinate link arm parallel to the (1_2)-nd transfer link arm, a (1_4)-th subordinate link arm parallel to the first common link arm, and a first end effector, wherein a first transfer driving motor and a first speed reducer, interlocked with the first transfer driving motor to reduce a rotational speed of the first transfer driving motor by half, are installed in a sealed inner space of the (1_1)-st transfer link arm, wherein a (1_1)-st drive shaft, having a hollow formed therein and interlocked with the first speed reducer, and a (1_1)-st output shaft interlocked with the (1_1)-st drive shaft are sealingly installed on a (1_1)-st one-end area of the (1_1)-st transfer link arm, wherein a (1_2)-nd drive shaft, having a hollow formed therein and interlocked with the first transfer driving motor, and a (1_2)-nd output shaft interlocked with the (1_2)-nd drive shaft are sealingly installed on a (1_1)-st opposite-end area of the (1_1)-st transfer link arm, wherein the (1_1)-st output shaft of the (1_1)-st transfer link arm is fixedly engaged with a first linking member that is inserted into the second upper space of the transfer arm platform to be fixedly engaged with the second locking member, wherein a (1_2)-nd one-end area of the (1_2)-nd transfer link arm is fixedly engaged with the (1-2)-nd output shaft of the (1_1)-st transfer link arm through a first fixed coupling shaft, wherein a second center area of the first common link arm is rotatably engaged with the first fixed coupling shaft, wherein a (1_4)-th one-end area of the (1_1)-st subordinate link arm is rotatably engaged with the (1_1)-st blade of the first link connecting member of the transfer arm platform, and a (1_4)-th opposite-end area of the (1_1)-st subordinate link arm is rotatably engaged with a (1_3)-rd one-end area of the first common link arm, wherein a (1_5)-th one-end area of the (1_2)-nd subordinate link arm is rotatably engaged with the (2_1)-st blade of the second link connecting member of the transfer arm platform, and a (1_5)-th opposite-end area of the (1_2)-nd subordinate link arm is rotatably engaged with a (1_3)-rd opposite-end area of the first common link arm, wherein a (1_6)-th one-end area of the (1_3)-rd subordinate link arm is rotatably engaged with the (1_3)-rd opposite-end area of the first common link arm, wherein a (1_7)-th one-end area of the (1_4)-th subordinate link arm is rotatably engaged with a (1_6)-th opposite-end area of the (1_3)-rd subordinate link arm, and a (1_7)-th opposite-end area of the (1_4)-th subordinate link arm is rotatably engaged with a (1_2)-nd opposite-end area of the (1_2)-nd transfer link arm, and wherein the first end effector is fixed to the (1_7)-th opposite-end area of the (1_4)-th subordinate link arm to thereby support a first substrate of the substrates; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_1)-st transfer link arm, a (2_3)-rd subordinate link arm parallel to the (2_2)-nd transfer link arm, a (2_4)-th subordinate link arm parallel to the second common link arm, and a second end effector, wherein a second transfer driving motor and a second speed reducer, interlocked with the second transfer driving motor to reduce a rotational speed of the second transfer driving motor by half, are installed in a sealed inner space of the (2_1)-st transfer link arm, wherein a (2_1)-st drive shaft, having a hollow formed therein and interlocked with the second speed reducer, and a (2_1)-st output shaft interlocked with the (2_1)-st drive shaft are sealingly installed on a (2_1)-st one-end area of the (2_1)-st transfer link arm, wherein a (2_2)-nd drive shaft, having a hollow formed therein and interlocked with the second transfer driving motor, and a (2_2)-nd output shaft interlocked with the (2_2)-nd drive shaft are sealingly installed on a (2_1)-st opposite-end area of the (2_1)-st transfer link arm, wherein the (2_1)-st output shaft of the (2_1)-st transfer link arm is fixedly engaged with a second linking member that is inserted into the third upper space of the transfer arm platform to be fixedly engaged with the third locking member, wherein a (2_2)-nd one-end area of the (2_2)-nd transfer link arm is fixedly engaged with the (2-2)-nd output shaft of the (2_1)-st transfer link arm through a second fixed coupling shaft, wherein a third center area of the second common link arm is rotatably engaged with the second fixed coupling shaft, wherein a (2_4)-th one-end area of the (2_1)-st subordinate link arm is rotatably engaged with the (1_2)-nd blade of the first link connecting member of the transfer arm platform, and a (2_4)-th opposite-end area of the (2_1)-st subordinate link arm is rotatably engaged with a (2_3)-rd one-end area of the second common link arm, wherein a (2_5)-th one-end area of the (2_2)-nd subordinate link arm is rotatably engaged with the (2_2)-nd blade of the second link connecting member of the transfer arm platform, and a (2_5)-th opposite-end area of the (2_2)-nd subordinate link arm is rotatably engaged with a (2_3)-rd opposite-end area of the second common link arm, wherein a (2_6)-th one-end area of the (2_3)-rd subordinate link arm is rotatably engaged with the (2_3)-rd opposite-end area of the second common link arm, wherein a (2_7)-th one-end area of the (2_4)-th subordinate link arm is rotatably engaged with a (2_6)-th opposite-end area of the (2_3)-rd subordinate link arm, and a (2_7)-th opposite-end area of the (2_4)-th subordinate link arm is rotatably engaged with a (2_2)-nd opposite-end area of the (2_2)-nd transfer link arm, and wherein the second end effector is fixedly engaged with the (2_7)-th opposite-end area of the (2_4)-th subordinate link arm through a bracket to thereby support a second substrate of the substrates, wherein the bracket has a "⊏" shape, and wherein the first end effector and the second end effector are separated by a distance between an upper surface and a lower surface of the bracket, to thereby allow each of the first end effector and the second end effector to support the first and second substrates at different heights.

2. The substrate transfer robot of claim 1, wherein the (1_1)-st opposite-end area of the (1_1)-st transfer link arm of the first transfer arm part is located at the front area of the transfer arm platform, and the (2_1)-st opposite-end area of the (2_1)-st transfer link arm of the second transfer arm part is located at the rear area of the transfer arm platform.

3. The substrate transfer robot of claim 1, wherein a joint, to which the (1_6)-th one-end area of the (1_3)-rd subordinate link arm and the (1_3)-rd opposite-end area of the first common link arm of the first transfer arm part are linked, is formed at a location same as or different from a location of a joint, to which the (1_5)-th opposite-end area of the (1_2)-nd subordinate link arm and the (1_3)-rd opposite-end area of the first common link arm of the first transfer arm part are linked, wherein a joint, to which the (2_6)-th one-end area of the (2_3)-rd subordinate link arm and the (2_3)-rd opposite-end area of the second common link arm of the second transfer arm part are linked, is formed at a location same as or different from a location of a joint, to which the (2_5)-th opposite-end area of the (2_2)-nd subordinate link arm and the (2_3)-rd opposite-end area of the second common link arm of the second transfer arm part are linked.

4. The substrate transfer robot of claim 1, wherein the transfer arm platform further includes: a first wiring hole bridging the first upper space and the second lower space; and a second wiring hole bridging the first upper space and the third lower space.

5. The substrate transfer robot of claim 1, wherein the transfer arm platform further includes: a (1_1)-st wiring hole and a (1_2)-nd wiring hole, each bridging the first upper space and one side of a body of the transfer arm platform; a (2_1)-st wiring hole, bridging the second lower space and the one side of the body of the transfer arm platform; a (2_2)-nd wiring hole, bridging the third lower space and the one side of the body of the transfer arm platform; a first sealing cover, sealing the (1_1)-st wiring hole and the (2_1)-st wiring hole at the one side of the body of the transfer arm platform; and a second sealing cover, sealing the (1_2)-nd wiring hole and the (2_2)-nd wiring hole at the one side of the body of the transfer arm platform.

6. The substrate transfer robot of claim 1, wherein the substrate transfer robot further includes: a first wiring for an operation of the first transfer driving motor; and a second wiring for an operation of the second transfer driving motor, wherein the first wiring is fed into the first transfer driving motor through the hollow of the support shaft and the hollow of the (1_1)-st drive shaft so as to prevent the first wiring from being exposed to an inner space of the vacuum chamber, and wherein the second wiring is fed into the second transfer driving motor through the hollow of the support shaft and the hollow of the (2_1)-st drive shaft so as to prevent the second wiring from being exposed to the inner space of the vacuum chamber.

* * * * *